(12) United States Patent
Birke et al.

(10) Patent No.: US 8,076,025 B2
(45) Date of Patent: *Dec. 13, 2011

(54) FILMS FOR ELECTROCHEMICAL STRUCTURAL ELEMENTS AND METHOD FOR PRODUCING SUCH FILMS

(75) Inventors: Peter Birke, Ellwangen (DE); Fatima Salam, Ellwangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/412,031

(22) Filed: Mar. 26, 2009

(65) Prior Publication Data

US 2009/0263715 A1 Oct. 22, 2009

Related U.S. Application Data

(62) Division of application No. 10/129,029, filed on Apr. 29, 2002, now Pat. No. 7,524,580.

(30) Foreign Application Priority Data

Oct. 29, 1999 (DE) .................... 199 52 335

(51) Int. Cl.
  *H01M 6/16* (2006.01)
  *H01M 6/18* (2006.01)
  *H01M 4/62* (2006.01)
(52) U.S. Cl. ......... 429/217; 429/303; 429/316; 429/338
(58) Field of Classification Search .................. 429/129, 429/215, 217, 303, 316, 338
  See application file for complete search history.

(56) References Cited

U.S. PATENT DOCUMENTS

| | | |
|---|---|---|
| 4,990,413 A | 2/1991 | Lee et al. |
| 5,009,970 A | 4/1991 | Kronfli et al. |
| 5,041,346 A | 8/1991 | Giles |

(Continued)

FOREIGN PATENT DOCUMENTS

CA 2331040 11/1999

(Continued)

OTHER PUBLICATIONS

Linden, editor, "Handbook of Batteries, 3rd Edition," McGraw-Hill, publishers, 2002, pp. 1.3-1.4.

*Primary Examiner* — Tracy Dove
(74) *Attorney, Agent, or Firm* — Duane Morris LLP (57) ABSTRACT

The invention relates to a paste-like mass that can be used in electrochemical structural elements, including a heterogeneous mixture of (1.) a matrix (A) containing at least one organic polymer, precursors thereof, or prepolymers thereof, and a plasticizer, and (2.) an electrochemically activatable inorganic material in the form of a solid substance (B), the material not being soluble in the matrix and in water, with the proviso that a conductor that is soluble in the plasticizer and that is different from (B) is not present in the mixture, wherein the plasticizer is present in a quantity of up to about 5% by weight, relative to the quantity of the electrochemically activatable material. Self-supporting layers or layers that are placed on a substrate can be prepared from the paste-like mass. Composite layers having electrochemical properties are obtainable by combining such a layer wherein (B) is a positive electrode material, a layer wherein (B) has solid electrolyte properties, and a layer wherein (B) is a negative electrode material and can be used in rechargeable electrochemical cells.

12 Claims, 3 Drawing Sheets

U.S. PATENT DOCUMENTS

| | | |
|---|---|---|
| 5,418,089 A | 5/1995 | Chaloner-Gill et al. |
| 5,456,000 A | 10/1995 | Gozdz et al. |
| 5,529,707 A | 6/1996 | Kejha |
| 5,620,811 A | 4/1997 | Zhang et al. |
| 5,707,759 A | 1/1998 | Simon et al. |
| 5,720,780 A | 2/1998 | Liu et al. |
| 5,972,055 A | 10/1999 | Gao et al. |
| 6,268,087 B1 | 7/2001 | Kim et al. |
| 6,342,320 B2 | 1/2002 | Liu et al. |
| 6,706,441 B1 * | 3/2004 | Birke et al. ................ 429/218.1 |
| 6,949,285 B1 * | 9/2005 | Tobinaga et al. .......... 428/317.9 |
| 6,991,874 B1 | 1/2006 | Mohwald et al. |

FOREIGN PATENT DOCUMENTS

| | | |
|---|---|---|
| WO | WO 95/16285 | 6/1995 |
| WO | WO 97/49106 | 12/1997 |
| WO | WO 00/13249 | 3/2000 |
| WO | WO 00/24088 | 4/2000 |
| WO | WO 00/63984 | 10/2000 |

* cited by examiner

FILMS FOR ELECTROCHEMICAL STRUCTURAL ELEMENTS AND METHOD FOR PRODUCING SUCH FILMS

CROSS-REFERENCE TO RELATED APPLICATIONS

This application is a divisional of U.S. Ser. No. 10/129,029, filed Apr. 29, 2002 now U.S. Pat. No. 7,524,580, now scheduled to issue.

The present invention relates to novel materials with electrochemical properties, in particular to films and to composite layers produced therefrom as well as to paste-like masses which are suitable for the production of said films. The invention is suitable for the production of batteries, accumulators, electrochromic elements, or the like, particularly for rechargeable systems made in film technology which in the following are designated as cells or generally as "systems". These systems are understood to comprise among others such systems which in the Anglo-Saxon speech area are called primary and secondary batteries, systems and cells.

Since the beginning of the 1970's there have been attempts to produce electrochemical structural elements such as accumulators or the like in the form of thin layers. The goal has been to obtain composite films that are both flexible enough that they can be, for instance, rolled up or made to conform to another desired shape and that also have particularly favorable charging and discharging properties due to an extremely high contact area between the individual electrochemical components, such as electrodes and electrolytes, relative to the volume of the active electrochemical material used. Apart from a few exceptions, this construction (film technology) was to present substantial advantages. In general, it will not be used only if (a) extreme requirements are to be made on the system, or (b) particular electrochemical advantages exist.

In patent literature, a number of methods for producing such films has been described. U.S. Pat. No. 5,009,970 describes the production of a solid polymer electrolyte for use in an electrochemical cell (for instance a rechargeable lithium cell). Polyethylene oxide (PEO) is used as a polymer which is mixed with an adequate lithium salt in water, whereby a complex of the two components is obtained. The PEO is cross-linked by radiation. A hydrogel is obtained that is to be dried subsequently under vacuum. U.S. Pat. No. 5,041,346 also describes an oxymethylene cross-linked variant of an ethylene oxide polymer electrolyte which additionally contains a softener that preferably has ion-solvating properties, for example, that can be a dipolar aprotic solvent such as γ-butyrolactone. However, it has been reported that although the ion conductivity compared to pure solid lithium salt is drastically increased, it is still not sufficient for use as an electrolyte layer in electrochemical structural elements.

U.S. Pat. No. 5,707,759 describes an anode material, also intended for a rechargeable lithium cell, the polymer material in this case being produced from polyvinyl alcohol and polyvinyl butyral. These materials are dissolved in a solvent (water, alcohol, N-methylpyrrolidone) and mixed with the electrochemically activatable material (graphite). The paste obtained is applied onto a carrier and dried.

U.S. Pat. No. 5,456,000 describes rechargeable battery cells which are produced from self-supporting films by lamination of electrode and electrolyte cells. A film or a membrane is used as positive electrode which has separately been produced from $LiMn_2O_4$ powder in a matrix solution of a copolymer and has subsequently been dried. The negative electrode consists of a dried coating of a pulverized carbon dispersion in a matrix solution of a copolymer. Between the electrode layers, an electrolyte/separator membrane is provided. For this purpose, a poly(vinylidene fluoride) hexafluoropropylene copolymer in acetone or THF or the like is reacted with a large quantity of a substance, such as propylene carbonate or dimethyl phthalate or another higher-boiling plasticizer, that is suitable as a solvent for electrolyte salts. From these components, a film is produced. For activating the battery, it is immersed in the respective electrolyte solution, the separator membrane thereby soaking with the electrolyte solution. Due to the high proportion of plasticizer, the films present a very bad aging resistance; after storage periods of several weeks, modifications in consistency and brittleness to the point of decomposition to powder are observed which is possibly due to an interaction with environmental moisture. Therefore in the variant described as preferred, the plasticizer is expelled in advance, which requires expensive washing steps. Moreover, the absorption capacity of the electrolyte is reduced. The washing step further causes tensions and decontactings in a cell produced with said film; the mechanical stability is considerably affected. Also, electrochemical decompositions are observed if the cell is activated subsequently. The films being laminated prior to removing the plasticizer, lamination can only be effected at a reduced temperature relative to the melting point of the polymer (about 145-150° C.), said temperature not being allowed to exceed 80-130° C. depending on the proportion of plasticizer. A further disadvantage is the direct contact of the subsequently filled-in liquid electrolyte with the contact networks which are usually aluminum on the positive side and copper on the negative side, said direct contact being due to the porous structure. Consequently, decompositions of the electrolyte between two metals without reference can occur.

All films according to the prior art discussed above in this specification have one or several of the following disadvantages:

(I) The pressure or heat lamination of the individual films to an electrochemical composite layer is insufficient.
(II) The electrochemical stability of the elements produced from the film laminate is insufficient.
(III) The films shrink, tear or glue together after extraction of the solvent.
(IV) The aging stability of the films ready for use is insufficient, particularly in case of chemical or mechanical stress, even if this stress is only small.
(V) A number of the proposed plasticizers, such as dialkyl phthalates, are poisonous or water toxic. Others are non-recyclable or only hardly recyclable.
(VI) Some of the films are hygroscopic. In such case, the lamiate is decontacted and partly destroyed by steam bubbles during lamination due to the influence of heat or pressure. Particularly films for lithium cells and for all systems in which water can be decomposed even when making use of a possible excess potential must not be hygroscopic.
(VII) The flexibility and stability of the film obtained is not sufficient for producing rolled-up electrochemically active systems therefrom.

The problem of the present invention is to provide films having improved properties from which electrochemical structural elements in the form of thin composite layers can be produced. The films thus produced shall not present the aforementioned disadvantages of prior art. Moreover, paste-like masses are provided from which such films can be produced.

Particularly, the invention shall provide films having a very high flexibility and tensile resistance, whereby the composite layers having electrochemical properties that have been laminated therefrom provide products such as rechargeable batteries (accumulators), electrochromic structural elements or the like, which also have a high flexibility and very good electron and ion conducting properties.

This object is achieved in that, in accordance with the invention, paste-like masses that can be used in electrochemical structural elements are provided that comprise a heterogeneous mixture of a matrix (A) containing at least one organic polymer, precursors thereof, or prepolymers thereof, and a plasticizer, or consisting of said components, and an electrochemically activatable inorganic material in the form of a solid substance (B), said material not being soluble in said matrix and in water. Films having the desired properties can be produced from said masses, which films can then be connected to corresponding electrochemical structural elements.

The term "that can be used in electrochemical elements" implies that the electrochemically activatable inorganic material that is in the form of a solid substance must be an ion-conducting or electron-conducting material that is suitable as an electrode material or as a solid electrolyte.

A conductor (irrespective of whether it is an ion, an electron or a mixed conductor) that is soluble in the plasticizer and that is different from (B) shall not be present in the mixture.

The invention is also described in more detail by figures, FIGS. 1-3 showing the cycle data of three cells which have been produced according to example 1.

The mass obtains its paste-like consistency by using a suitable matrix (A). The term "paste-like" means that the mass, once it has been produced, can be processed using usual paste application methods, for example by calendering, extrusion, casting, brushing, spatula coating, knife coating, or it can be applied to a base by various printing methods, whereby mainly but not exclusively self-supporting layers are to be produced. Depending on the need, the mass can be made to be relatively thin to very viscous.

A plurality of materials can be used for the matrix (A). Systems containing solvents or solvent-free systems can be used. Solvent-free systems that are suitable are, for example, cross-linkable liquid or paste-like resin systems. Examples are resins made of cross-linkable addition polymers or condensation resins. For instance, pre-condensates of phenoplasts (novolaks) or aminoplasts can be used that are finally cross-linked to the layer of an electrochemical composite layer after the paste-like mass has been formed. Additional examples are unsaturated polyesters, such as polyester that can be cross-linked to styrene by graft copolymerization, epoxy resins that are curable by bifunctional reaction partners (for example bisphenol A epoxy resin, cold cured with polyamide), polycarbonates that can be cross-linked such as a polyisocyanurate that can be cross-linked by a polyol, or a binary polymethyl methacrylate, which can also be polymerized with styrene. In any of these cases, the paste-like mass is formed from the more or less viscous pre-condensate or non-cross-linked polymer and the plasticizer as matrix (A), or using essential components thereof, together with the component (B).

Another option is the use of polymers or polymer precursors together with a solvent or swelling agent for the organic polymer. In principle, there is no limit in terms of the synthetic or natural polymers that can be used. Not only polymers with a carbon backbone chain can be used, but also polymers containing hetero ions within the backbone chain, such as polyamides, polyesters, proteins, or polysaccharides. The polymers can be homopolymers or copolymers; the copolymers can be statistical copolymers, graft copolymers, block copolymers, or polyblends, there is no limitation. In terms of polymers with a pure carbon backbone, natural or synthetic rubbers can be used, for instance. Fluorinated hydrocarbon polymers such as Teflon, polyvinylidene fluoride (PVDF) or polyvinyl chloride are particularly preferred, since these make it possible to obtain particularly good water-repellant properties in the films or layers formed from the paste-like mass. This imparts particularly good long-term stability to the electrochemical structural elements thus produced. Additional examples are polystyrene or polyurethane. Particularly preferred examples of copolymers are copolymers of Teflon and of amorphous fluoropolymer, and polyvinylidene fluoride/hexafluoropropylene (commercially available as Kynarflex). Examples of polymers with heteroatoms in the main chain are polyamides of the diamine dicarboxylic acid type or of the amino acid type, polycarbonates, polyacetals, polyethers, and acrylic resins. Additional materials include natural and synthetic polysaccharides (homeoglycans and heteroglycans), proteoglycans, for example, starch, cellulose, methylcellulose. In addition, substances such as chondroitin sulfate, hyaluronic acid, chitin, natural or synthetic waxes, and many other substances can be used. In addition, the aforesaid resins (precondensates) can be used in solvents and diluents.

One skilled in the art is familiar with solvents and swelling agents for the aforesaid polymers.

A plasticizer (also designated as softener) for the polymer(s) used is a substantial component of the matrix (A). "Plasticizer" or "softener" should be understood to define substances the molecules of which are bonded to the plastic molecules by secondary valence forces (Van der Waals forces) and which thus reduce the interacting forces between the macromolecules and therefore reduce the softening temperature and the brittleness and hardness of the plastics. Thus, a number of substances which are usually designated as swelling agents is understood to be comprised therein. Using a plasticizer in accordance with the invention effects high mechanical flexibility of the layer that can be produced from the paste-like mass.

In accordance with the invention, the electrochemically activatable material of the paste-like mass (B) is not soluble in the plasticizer (nor of course in the solvent or swelling agent possibly used for the polymer).

Surprisingly, it has been found that all aforesaid disadvantages can simultaneously be avoided, and that additional particular advantages that are listed further below can be realized, if the plasticizer is selected from among substances and mixtures of substances carrying the group wherein independently of each other $A^1$ and $A^2$ can be $R^1$, $OR^1$, $SR^1$ or $NHR^1$, or $A^1$ and $A^2$ together with D form a hetero-5-ring, and D can be $C=O$, $S=O$, $C=NH$ or $C=CH_2$ and further, if D forms said hetero-5-ring with $A^1$ and $A^2$, D can also be O, S, NH or $CH_2$. $R^1$ is a (straight-chain or branched-chain or optionally cyclic) $C_1$-$C_6$ alkyl radical. Preferably, $R^1$ is methyl, ethyl, n-or iso-propyl, n-or iso-butyl.

By the aforesaid criterions, mainly carbonates or esters and their sulfur and amino analogues are comprised.

As it can easily be seen from the above formula, the spatial structure of the plasticizers which according to the invention, have been found to be particularly advantageous, comprises the group $A^1$-D-$A^2$ wherein either the bonds of D are under ring strain due to the ring closure between $A^1$ and $A^2$ or wherein D contains a quadricovalent atom which forms a double bond and two single bonds. Consequently, the group $A^1$-D-$A^2$ has a tetrahedral, planar tetrahedral, or planar basic structure.

According to a preferred embodiment, $A^1$ and $A^2$ consist of the groups O, $CHR^2$, NH or S, wherein $R^2$ is hydrogen, methyl, or ethyl, and form a hetero-5-ring together with D. More preferably, $A^1$ plus $A^2$ together in this ring are -$E^1$-$CHR^2$—$CHR^2$-$E^2$-, wherein $E^1$ and $E^2$ are identical or different and mean S, O, $CHR^2$ or NH. The most preferred plasticizers are listed in the following table which simultaneously shows the classification of the substance(s) in the respective chemical danger classes.

TABLE 1

| Name | Appearance | Empirical Formula | Classification |
|---|---|---|---|
| Dimethyl sulfoxide * | tetrahedral | $C_2H_6OS$ | $X_i$ |
| Dimethyl carbonate | tetrahedral, linear portions | $C_3H_6O_3$ | unobjectionable |
| Ethylmethyl carbonate | | $C_4H_8O_3$ | |
| Diethyl carbonate | | $C_5H_{10}O_3$ | |
| Methylpropyl carbonate | | $C_5H_{10}O_3$ | |
| Ethylene carbonate | tetrahedral, five-membered ring ether-like | $C_3H_4O_3$ | $X_i$ |
| 1* Ethylene sulfite | | $C_2H_4O_3S$ | unobjectionable |
| 2* N-N'-ethylene urea | | $C_3H_6N_2O$ | $X_n$ |
| 3* Propylene carbonate | | $C_4H_6O_3$ | $X_i$ |
| $CH_3$ group | | $C_3H_6O_2$ | unobjectionable |
| 4* Dioxolane | | | |
| 5* Tetrahydrofurane | five-membered ring, ether-like | $C_4H_8O$ | $X_i$ |
| 6* g-butyrolactone | | $C_4H_6O_2$ | $X_n$ |
| O-group | | | |

\* Dimethyl sulfoxide can be derived structurally from dimethyl carbonate by omitting the two oxygen atoms which are linked by single bonds to the central C atom of the tetrahedron, and by substituting the central C atom against sulfur.
1* The central C atom in the tetrahedron of the ethylene sulfite, compared to ethylene carbonate, is substituted against sulfur.
2* The two oxygen atoms of N-N'-ethylene urea, compared to ethylene carbonate, which oxygen atoms are linked to the tetrahedron by single bonds, are substituted by NH groups.
3* Propylene carbonate, compared to ethylene carbonate, has an additional $CH_3$ methyl group which is substituted against a hydrogen of the $CH_2$ group.
4* The oxygen atom of dioxolane, compared to ethylene carbonate, which oxygen atom is linked by a double bond to the C atom of the tetrahedron, is substituted by a $H_2$ group. Thereby, the character is changed towards an ether.
5* Tetrahydrofurane is derived from ethylene carbonate by substituting the central C atom of the tetrahedron with an oxygen atom, and by substituting the oxygen atoms that have been linked to the tetrahedron by single bonds with $CH_2$ groups. Thereby, the tetrahedron disappears and the five-membered ring structure remains. The chemical character changes towards a cyclic ether.
6* The γ-butyrolactone is derived from the tetrahydrofurane by substituting two hydrogens of a $CH_2$ group that is directly linked with the oxygen atom of the ring against an oxygen atom.

In the composition according to the invention, the plasticizer has a direct effect on the consistency, homogeneity and flexibility of the film. Substances having an asymmetric ring structure are particularly preferred; very good results are also obtained with a symmetric ring structure, said results being only slightly inferior to those of the first group. Without a closed ring, the result goes somewhat down, possibly due to an increased volatility. Particularly surprisingly, the storage life and the flexibility of the material are considerably improved, even if the plasticizer proportion is very small. These properties are so much more astonishing as many substances which are comprised by the definition of the plasticizer to be used according to the invention have rather been known as swelling agents so far.

The inventive improvement in the electrochemical stability of the electrochemical structural elements produced from the pastes and layers or foils as described above is possibly achieved by a thin ion-conducting or mixed-conducting solid layer being formed as a reaction product of the plasticizer with lithium and/or other electrode components on both sides or on one side only (i.e. of the positive/negative electrode) by an electrochemical side reaction when the cell is formed or formulated (charged and cycled for the first time). Particularly sulfur and nitrogen atoms in the plasticizer seem to support the formation of such a layer in connection with a good ionic conductivity on the negative side. The electrochemical stability against oxidation (positive side) is extremely favored by a tetrahedron and/or by a ring in the molecule structure of the plasticizer. Substitutions with sulfur, nitrogen, hydrogen or groups formed thereof in the molecule seem to show an opposite effect regarding very high oxidation stabilities.

It is preferred to use the plasticizer in a quantity that is not too large. 0.05-50% by weight can be suitable; up to 15% by weight are preferably, about 12% or less are more preferably, about up to 10% by weight are even more preferably, and not more than about 5% by weight are most preferably present in the matrix, the quantity being in relation to the quantity of the electrochemically activatable material. It is recommended to keep the quantity of plasticizer always as small as possible for the respective system. If it is desirable for technical processing considerations to incorporate a relatively large quantity into the paste-like mass, part of the plasticizer can subsequently (e.g. after forming the film) be removed, for instance by vacuum extraction e.g. at up to $10^{-2}$ mbar, if necessary at an increased temperature (up to about 150° C., preferably at 65-80° C.). Alternatively, the extraction can be effected at ambient pressure by drying and heating at preferably 120° C., if necessary up to 200° C.

The inventive paste-like masses are usually produced by mixing the required components, preferably in the presence of a solvent for the organic polymer or its precursors or prepolymers thereof of the matrix (A). The application of pressure, e.g. by using an extruder, is normally not required, but may be envisaged if necessary.

The finding according to the invention, that the presence of a plasticizer, particularly of that of the preferred structures, considerably improves the properties of the film produced, whereby, however, the quantity of said plasticizer should advantageously be kept as small as possible, was surprising. It is possible that an unexpected property of the polymer-softener mixtures is jointly responsible thereof: If a minimum quantity is used that is just tolerable for the consistency of the film, the lamination of the films can astonishingly be effected at temperatures in the range of the melting point of the polymer or at somewhat higher temperatures, although polymer-softener mixtures should normally present a melting-point depression. The laminates obtained thereby are laminated by the polymer and are therefore particularly durable and have particularly good contact properties. In contrast thereto, if the lamination is partly effected via the plasticizer, which is inevitable in case of high plasticizer portions in the matrix, this has disadvantageous consequences, one reason among others being that the plasticizer can diffuse within the laminate in the course of time.

A further advantage of small plasticizer quantities is the reduction of the incorporation of water into the films (plasticizers are usually hygroscopic), which might remain there and be enclosed therein. In accordance with the invention, an extremely small inclusion of water during production is achieved, and the films thus produced can easily and elegantly be dried using standard methods.

As mentioned, the inventive paste-like masses are suitable for producing thin layers, e.g. films from which thin-film batteries and other similar electrochemical structural elements such as electrochromic structural elements can be produced. The individual layers or films of these elements are also called "tapes". Individual electrochemically active or activatable layers are placed upon one another, and brought into intimate contact.

The present invention therefore furthermore comprises electrochemically active or activatable layers or films that can be produced from the paste-like masses described in the foregoing, that are self-supporting or that are placed on a substrate, preferably in the thicknesses indicated. The layers are preferably flexible.

The consistency of the films is a result of use of the matrix described above in more detail, said matrix consisting of supporting polymers as described above which if necessary (and preferably) are soluble in a solvent like acetone, and of one or more plasticizer(s) (softener(s)) as described above. Whereas the solvent that is optionally used for producing the paste is preferably removed during or after the paste has solidified to film shape (e.g. by degasifying in vacuum and/or by heat), the plasticizer remains at least partly in the film obtained. The fact that the plasticizer remains in the film contributes to avoiding sedimentation of powdered components during film production. In fact, many of the polymer compositions described in the foregoing (e.g. a preferred composition of a copolymer of polyvinylidene fluoride/hexafluoropropylene, (PVDF/HFP, Kynarflex) or a composition using substantial parts thereof) have only a small degree of crystallinity, a high flexibility and only a weak tendency to embrittlement. However, a possible separation and sedimentation during film production can not be avoided with certainty.

For producing both the self-supporting layers (films, tapes) and the layers that can be placed on a substrate, one can fall back to methods known in prior art that can be used for the corresponding polymer materials of the matrix. Important techniques are the so called tape casting, the so-called "reverse-roll-on-coating", casting, spraying, brushing, or rolling. The consolidation of the paste-like masses then occurs, depending on the material, for example by curing (of resins or other precondensates), by cross-linking prepolymerisates or linear polymerisates, by evaporating solvents, or in a similar manner. In order to obtain self-supporting films, a suitable paste-like mass can for instance be formed in the appropriate thickness on calenders. Standard technology can be used for this. Self-supporting layers can also be formed by applying the paste-like mass to a substrate and removing the layer produced after it has consolidated. The coating process can be performed using conventional paste application methods. For instance, application can be performed by brush, rake, spraying, spin coating and the like. Printing techniques can also be used. The lamination of films to a composite is effected at a suitable temperature, for the system PVDF/HFD mentioned before for instance in an appropriate manner at 100°-250° C., preferably in the range of 135-150° C. If necessary, temperature gradients may be applied. Continuous films can be laminated in a dynamical continuous way using a pressure of preferably about 0.5 kg/20 cm$^2$.

In one embodiment of the invention, cross-linkable resin masses (pre-condensates) are used as described above for the paste-like masses, and are cured by UV or electron radiation once the layer has been formed. Curing can naturally also be thermal or chemical (for example by immersing the produced layer in an appropriate bath). If necessary, suitable initiators or accelerators or the like are added to the masses for respective cross-linking.

The production of films provided for electrochemical structural elements in accordance with the invention has a number of advantages: (a) The production of large numbers of pieces having the storage life of the basic materials is favorable (the layers that have not yet been connected to an electrochemical composite layer can be stored very safely). (b) A flexible and variable shaping is possible. (c) The films can be stored in a space-saving manner (e.g. by stacked and/or rolled up film webs). (d) Due to the absence of low-boiling materials and to the presence of solid ion conductors, a higher temperature resistance is obtained. (e) Due to the solid condition of the electrochemically activatable components, the films are leakage-safe and corrosion-resistant. (f) Since in a preferred manner, matrices and plasticizers are used that are substantially recognized as safe with regard to health, the binding material can be extracted after use, and the basic materials can be recovered by filtration and can be recycled. (g) Different electrode and electrolyte materials can be incorporated into the films, independent of their particle size and geometry, their density and their functional groups on the surface. This is also the case for metallic powder that can be used as an agent which improves electronic conductivity, and that also may have special surfaces (e.g. in the form of flakes, such as nickel flakes).

In one particular embodiment of the invention, the films produced from the paste-like masses in accordance with the invention are subsequently impregnated with a second dissolved electrolyte. This can for instance be effected by spraying an electrolyte solution onto the film or onto the laminated composite film or by immersing the film or the composite film into the respective solution. This can be effected in a particularly preferred manner with such films/composite films from which excess plasticizer has been removed in advance as described above, or for which only a very small quantity of plasticizer has originally been used. After impregnating the film or the composite film, it is advantageously dried, e.g. maintained at a temperature of 70-90° C. for some hours. During this "conversion", a very thin, flexible, ion conducting layer of reaction products of polymer, softener and electrolyte is formed. As a consequence of the absorption process described, the electrolyte is jellified or solidified; despite the use of a dissolved electrolyte, the tape or the cell (i.e. the film or the composite film) thus obtained is particularly leakage-safe. Suitable electrolytes are, for instance, salts of lithium. $LiClO_4$, $LiNO_3$, $LiBF_4$, $LiPF_6$, $LiSO_3CF_3$ or $LiC(SO_2CF_3)_3$ or mixtures thereof are used with particular advantage. Preferably, plasticizers are used as solvents that have been defined above as inventive component of the matrix (A), and among them preferably such plasticizers having the group $A^1$-D-$A^2$, as also defined above, alone or in mixture. The plasticizer selected or the plasticizer mixture selected should be liquid at the processing temperature.

The inventive films are not particularly limited in their thickness (width); one skilled in the art will respectively select the thickness which is appropriate for an application. For instance, suitable thicknesses are from about 10 μm, more preferable from about 50 μm, up to about 1 to 2 mm and if necessary more (e.g. up to about 10 mm, such films possibly being provided for stamping out small-dimensioned forms, e.g. for batteries and accumulators to be used in medicine, such as hearing aid batteries). Films for the production of electrochemical structural elements in so-called "thick-layer technology" have a thickness in the range of preferably about 50 μm to 500 μm, most preferably in the range of about 100-200 μm. In accordance with the invention it is, however, also possible to produce corresponding thin-layer structural elements (this term comprises thicknesses of preferably 100 nm up to a few μm). This application may, however, be restricted, since in a plurality of cases, corresponding structural elements may not satisfy usual capacity requirements. The application for backup chips is however possible.

The present invention furthermore relates to composite layers having electrochemical properties, particularly such as rechargeable accumulators and other batteries or electrochromic structural elements that are formed by or comprise a corresponding sequence of the aforesaid layers.

For producing composite layers, the individual paste-like masses can be applied layer by layer upon one another by means of paste application methods. Either each individual layer can be cross-linked per se or it can be freed from solvent or made into layer form in some other manner; however, it is also possible to consolidate the individual matrices by cross-linking or evaporating the solvent or swelling agent or the like once application of all of the required layers has been completed. This latter is advantageous, for instance, if the individual electrochemically activatable layers are applied using a printing method that occurs analogous to polychromy. An example of this is the flexographic printing technique, by means of which multiple meters/second of a substrate can be imprinted continuously with the required electrochemically activatable layers.

Alternatively, every layer or film can be converted individually into its final consolidated state. If these are self-supporting films, the appropriate components of the structural element to be formed can be stored separately, e.g. as rolled films, and subsequently be joined together by lamination. Conventional laminating techniques can be used for this. These include, for example, extrusion coating, whereby the second layer is bonded to a carrier layer by pressure rollers, calender coating using two or three roll nips, wherein the substrate web runs in addition to the paste-like mass, or doubling (bonding under pressure and counterpressure of preferably heated rollers). One skilled in the art will not have any problem finding the techniques that are appropriate depending on the selection of the matrices for the paste-like masses.

As stated in the foregoing, the inventive paste-like masses and layers or films produced therefrom are suitable for a plurality of electrochemical structural elements. One skilled in the art is able to select the same solid substances (B) that he would use for classic electrochemical structural elements, that is, substances (B) to which no plastics have been added.

In particular for lithium systems that can provide the highest practical volumetric and gravimetric energy densities, one is dependent on films. This is due to the requirement that large contact surfaces for compensating the ionic conductivity have to be provided, which, in turn, is smaller by three orders of magnitude compared to aqueous systems. Markets with high piece numbers in million, like the 3C market, require a continuous production method via films from the roll, since otherwise the required cycle times are not achievable.

In the following, a number of such lithium systems shall be mentioned as an example:

| | |
|---|---|
| lower contact electrode | Al, Cu, Pt, Au, C |
| positive electrode | all possible combinations of multinary compounds of lithium cobalt oxides, lithium nickel oxides and lithium manganese oxides, optionally substituted with magnesium, aluminum or fluorine |
| electrolyte | $Li_{1.3}Al_{0.3}Ti_{1.7}(PO_4)_3$, $LiTaO_3 \cdot SrTiO_3$, $LiTi_2(PO_4)_3 \cdot Li_2O$, $Li_4SiO_4 \cdot Li_3PO_4$, |
| negative electrode | carbon (in an optional modification), $TiO_2$, $TiS_2$ $WO_2$, $MoO_2$ lithium titanate, a lithium-alloyable metal, oxide, iodide, sulfide or nitride, a lithium-alloyable semiconductor and heterogeneous mixtures thereof |
| upper contact electrode | Al, Cu, Mo, W, Ti, V, Cr, Ni |

Examples of use are lithium cells, lithium polymer cells, lithium plastic cells, lithium solid body cells or lithium ion cells.

However, the present invention is of course not limited to lithium-technology accumulators, but rather, as stated in the foregoing, comprises all systems that can be produced using "conventional" technology, that is, without incorporating an organic polymer matrix.

The following describes a few special embodiments of the paste-like masses that are suitable for special structural elements or structural element parts. For those electrochemically activatable parts that are not prior art, it should be clear that these substances can also be used in "bulk form", i.e., without the polymer matrix in appropriate electrochemical structural elements.

Appropriately selecting the electrochemically active substances makes it possible to produce electrochemical structural elements, such as accumulators, whose characteristics in the charge/discharge curves make it possible to selectively control the charge/discharge status of the accumulator. Thus, mixtures of two of the electrode materials cited in the foregoing, or of other appropriate electrode materials, can be used as electrochemically activatable solid substance (B) for the positive or negative electrodes, the materials having different oxidation and reduction stages. Alternatively, one of the two substances can be replaced with carbon. This results in characteristic runs or courses in the charge/discharge curves which makes it possible to advantageously detect the charge or discharge status of an accumulator produced using such masses. The curves have two different plateaus. If the plateau that is near the discharge status is achieved, this status can be indicated to the user so that he knows that he will soon need to recharge, and vice versa.

If carbon and an element that can be alloyed with lithium is incorporated into a paste-like mass provided for a negative electrode, this imparts to the electrode (with properties of an alloy electrode and an intercalation electrode) that can be produced therefrom a particularly high capacity that has improved electrochemical stability. In addition, the expansion in volume is lower than in a pure intercalation electrode.

If the paste-like mass according to the invention is provided for an electrode, a conductivity improving agent can be added additionally. Graphite or amorphous carbon (carbon black) or a mixture of the two, but also a metallic powder or a nitride are suitable. Weight proportions of about 2.5 to about 35% by weight amorphous carbon relative to the electrochemically activatable component are particularly advantageous in this regard. If the mass is provided for a positive electrode, the lubricating effect of the carbon is an advantageous property to be mentioned that improves the mechanical flexibility of a layer produced from the paste-like mass. If the mass is provided for a negative electrode, additionally the electrochemical stability and the electronic conductivity are improved, as has been described in the foregoing.

The inventive paste-like mass can also be used for electrodes other than intercalation electrodes. An example of this is the use of metallic powder in combination with an alkali or earth alkali salt as the electrochemically activatable solid substance (B). A paste-like mass produced with this combination can be used to produce decomposition electrodes. The expansion in volume that is typical for intercalation electrodes does not occur in this case, which results in improved service life over time. An example of this is the combination of copper and lithium sulfate.

Surprisingly it has also been demonstrated that incorporating a phase mixture into the inventive paste-like mass consisting of $Li_4SiO_4.Li_3PO_4$, regardless of its intended electrochemical application, leads to an improvement in the plasticity of the electrodes or solid electrolytes produced therefrom. This requires that the phase mixture be ground extremely fine. The extremely small grain sizes must be the reason for an improved internal sliding effect.

Regardless of whether the solid substance (B) is an electrode material or an electrolyte material, it can consist of a lithium ion conductor and one or more additional ion conductors (Li, Cu, Ag, Mg, F, Cl, H). Electrodes and electrolyte layers made of these substances have particularly favorable electrochemical properties such as capacity, energy density, mechanical and electrochemical stability.

The components described in the foregoing from which the inventive paste-like mass is produced can be mixed in a conventional manner, preferably by vigorously agitating or kneading the components. Preferably, the organic polymer or its precursors are pre-dissolved or pre-swollen with the plasticizer in a solvent or swelling agent before the component (B) is added.

Embedding the solid substances (B) in the matrix (A) means that the powders of the electrochemically activatable substances do not have to be sintered at high temperatures, as is customary for "conventional" electrochemical structural elements. Such sintering would not result in the initial substances having a paste-like consistency.

The electrochemical structured parts that can be produced with the inventive paste-like masses are not limited. It is therefore understood that the embodiments described in the following are merely examples or particularly preferred embodiments.

Rechargeable electrochemical cells can be produced in this manner using thick-layer technology, i.e. with individual electrochemically activatable layers having a thickness of approximately 10 μm to approximately 1 to 2 mm and preferably of approximately 100-200 μm. If the electrochemical cell is to be based on lithium technology, the solid substances for the electrodes or electrolyte layers can be those substances that have already been enumerated in the foregoing for this purpose. At least three layers have to be provided in such cases, namely, one that functions as a positive electrode, one that functions as a solid body electrolyte, and one that functions as a negative electrode.

In accordance with the invention it has been demonstrated that particularly advantageous current densities can be obtained in the accumulator if certain limits are observed. As is known, current density can be adjusted by the resistance of the electrolyte. If it is too high, polarization can destroy the electrodes over the long term; if it is too low, the power of the produced accumulator is only sufficient for a few applications. The aforesaid limit is preferably 1 $mA/cm^2$. For instance, if the conductivity of an electrolyte is $10^{-4}$ S/cm, it is particularly advantageous for the electrolyte layer to be approximately 100 μm thick. A current density of 1 $mA/cm^2$ then causes a drop in voltage, caused by the resistance, that is a negligible 0.1 V. In contrast, if the conductivity of the electrolyte is $10^{-5}$ S/cm, for instance, the thickness of the electrolyte layer can be reduced to about 10 μm. It is therefore recommended that the layer thickness d be selected relative to conductivity $\sigma_{ion}$ and to an ionic resistance ($\Omega$) and relative to the surface A such that the following formula is satisfied:

$$200 \,\Omega < d/(\sigma_{ion} \cdot A)$$

The aforesaid three-layer cell (or any other desired electrochemical structural element, consisting of positive electrode/electrolyte/negative electrode) can additionally be provided with contact electrodes. It is useful that these comprise films of suitable materials (materials for contact electrodes that can be used in lithium technology are described earlier in this specification).

In a special embodiment of the invention, an additional thin plastic layer ("intermediate tape") is worked in between the lower contact electrode and the adjacent electrode and between the upper contact electrode and the adjacent electrode which plastic layer can also be produced using a paste-like mass of the present invention. This thin plastic layer should contain conducting metal elements or alloys of such elements that are suitable for transporting electrons from the electrode material to the contact electrode. Examples of this are the elements gold, platinum, rhodium, and carbon, or alloys of these elements, if the plastic layer is to be arranged between the positive electrode and the associated contact electrode. If it is to be arranged between the negative electrode and the contact electrode, the elements that are appropriate are nickel, iron, chromium, titanium, molybdenum, tungsten, vanadium, manganese, niobium, tantalum, cobalt, and carbon. The information provided in the foregoing about the electrodes and electrolytes also applies, of course, to the concentration and structure of the paste-like masses from which these layers are formed.

The electrochemical structural elements of the present invention can be sealed, for example in a plastic-based housing, particularly in an aluminum film coated with plastic. The weight in this case is advantageously less than that of metal housings; there are also advantages in terms of energy density.

The electrochemical composite layer (the electrochemical structural element) can also be embedded between two or more films made of a plastic coated with wax or paraffin. These materials act as a seal and, due to their inherent properties, can also exert mechanical pressure on the composite layer, thereby advantageously achieving improved contact in the composite layer due to the compression.

While the electrochemical element is sealed as described in the foregoing or in some other manner, the interior can be subjected to a pre-determined water/oxygen partial pressure that effects high electrochemical stability. This can be done, for instance, by sealing the electrochemical element in such an environment using parameters that have been selected and adjusted appropriately.

In another embodiment of the present invention, a layer is selected for the electrolyte layer that consists of two films of differing composition that have been laminated to one another, each of which being adapted to the electrode with which it is in contact. This has a positive effect on the stability of the phase limits between positive electrode and electrolyte 1 and between negative electrode and electrolyte 2. A concrete example of this embodiment is the use of lithium iodide for the electrolyte material of the first layer and $Li_{1.3}Al_{0.3}Ti_{1.7}(PO_4)_3$ for the electrolyte material of the second layer.

An example of a galvanic cell having electrochromic properties would be a series of layers consisting of the following sequence:

Conductor 1/Y/MeX-alcoholate/$WO_3$/Conductor 2.

In this sequence, the metal Me can be selected from among, for example, lithium, sodium, potassium, rubidium, and cesium, and its anion X from among, for example, the halogenides chloride, bromide, and iodide. Conductor 1 can be selected from among, for example, indium tin oxide (ITO), zinc aluminum oxide ($Zn_xAl_yO_z$) and silver. Conductor 2 can be selected from among, for example, indium tin oxide (ITO) and zinc aluminum oxide ($Zn_xAl_yO_z$).

The inventive sequences of layers for the electrochemical structural elements can be arranged in any desired shape. For instance, the flexible composite layers can be rolled up, which achieves a particularly advantageous geometry for compact accumulators. If the accumulator has a small volume, this provides a very large active battery surface. Non-self-supporting composite layers can also be applied to solid bases like walls for integrated energy storage (self-supporting composite films can of course also be applied or affixed thereto). In this case it is possible to take advantage of large surface areas. The accumulators themselves are not associated with a space requirement. A special example of an embodiment of this type is the integration of composite layers for accumulators into substrates for solar cells. Independent energy supply units can be created in this manner. Layer sequences for accumulators can also be applied to solid or flexible substrates in order to be used as integrated energy storage in electronic structures.

The concrete examples in the following provide a more detailed explanation of the invention.

EXAMPLE 1

A battery film (negative electrode) is produced by agitating 5 g finely powdered $Li_4Ti_5O_{12}$, 1.0 g acetylene carbon black (battery quality), 0.5 g ethylene carbonate with 1.25 g polyvinylidene fluoride hexafluoropropylene in about 50 g acetone for at least 4 hours using either a magnetic agitator or a dissolver. First, the mixture is heated to 10° C., and having reached this temperature, it is cooled down to 50° C. and then maintained at said temperature. Once the agitating time has terminated, the mixture is thickened until it can be casted or knife-coated, and the film is extruded using a tape casting equipment. The knife coating slot is selected such that after drying, a film thickness of 150-200 μm is obtained. The film is dried over night at 70° C. and 1 mbar final pressure in a vacuum drying cabinet.

EXAMPLE 2

A battery film (electrolyte) is prepared from 9 g finely powdered $LiAlSi_2O_6$ (spodumene), 0.9 g ethylene carbonate, 3.0 g polyvinylidene fluoride hexafluoropropylene, prepared in about 30 g acetone as is the negative electrode, and extruded to a thickness of 70-100 μm.

EXAMPLE 3

A battery film (positive electrode) is prepared from 8 g finely powdered $LiCoO_2$, 1.2 g acetylene carbon black (battery quality), 0.8 g ethylene carbonate, 2.0 g polyvinylidene fluoride hexafluoropropylene, and about 30 g acetone as is the negative electrode.

In all films, the purity of the initial materials shall not be substantially inferior to 99%.

Once having been cut to size, the individual films are laminated to a complete individual cell according to table 2.

TABLE 2

| Step | Films | Temperature | Force applied onto 6 × 3 cm² | Residence time |
|---|---|---|---|---|
| 1a | lamination on Cu-mesh | negative electrode $Li_4Ti_5O_{12}$ | 150° C. | 15 kN | 20 sec |
| 1b | lamination on Al-mesh | positive electrode $LiCoO_2$ | 150° C. | 10 kN | 10 sec |
| 2 | lamination elektrolyte on neg. electrode | elektrolyte $LiAlSi_2O_6$ (spodumene) + neg. electrode | 130° C. | 4 kN | 60 sec |
| 3 | symmetrical lamination of 2 pos. eledtrodes onto laminate of step 2 | pos. electrodes + laminate of 2 | 130° C. | 4 kN | 60 sec |

A total of 4 lamination steps is particularly advantageous for reasons regarding heat incorporation, 1a and 1 b are exchangeable with respect to their order, in steps 2 and 3, the duration of the lamination has been increased compared to 1a and 1b, since the electrolyte conducts the heat far worse than the electrodes. The meshes onto which the electrodes are laminated in steps 1a and 1b are pre-treated with a mixture of carbon black+polymer. The flexibility is maintained.

The quality of the lamination is very high, neither bubbles nor decontactings could be observed.

The completed cell is partly sealed in an aluminum film that is asymmetrically coated with plastic and has a thickness of 60 μm, the meshes being in contact with the outside using two contact studs. Subsequently, the cell is activated with a second solid electrolyte that is added in a absorbable solution (0.66 mol/l $LiBF_4$ in a mixture of ethylene carbonate and dimethyl carbonate in a proportion of 2:1 by weight), and then tightly sealed.

The lithium titanate $Li_4Ti_5O_{12}$ has been selected as negative electrode, since the fine, white/pale grey powder primarily is an ionic and electronic insulator and therefore represents a great challenge. A bond to the grain surfaces of the lithium titanate and the ability of the cell to cycle connected therewith is only possible for an optimum heterogeneous film wherein the electronic conductivity is conferred by the acetylene carbon black and the ionic conductivity is conferred by a second electrolyte.

Figure 1:
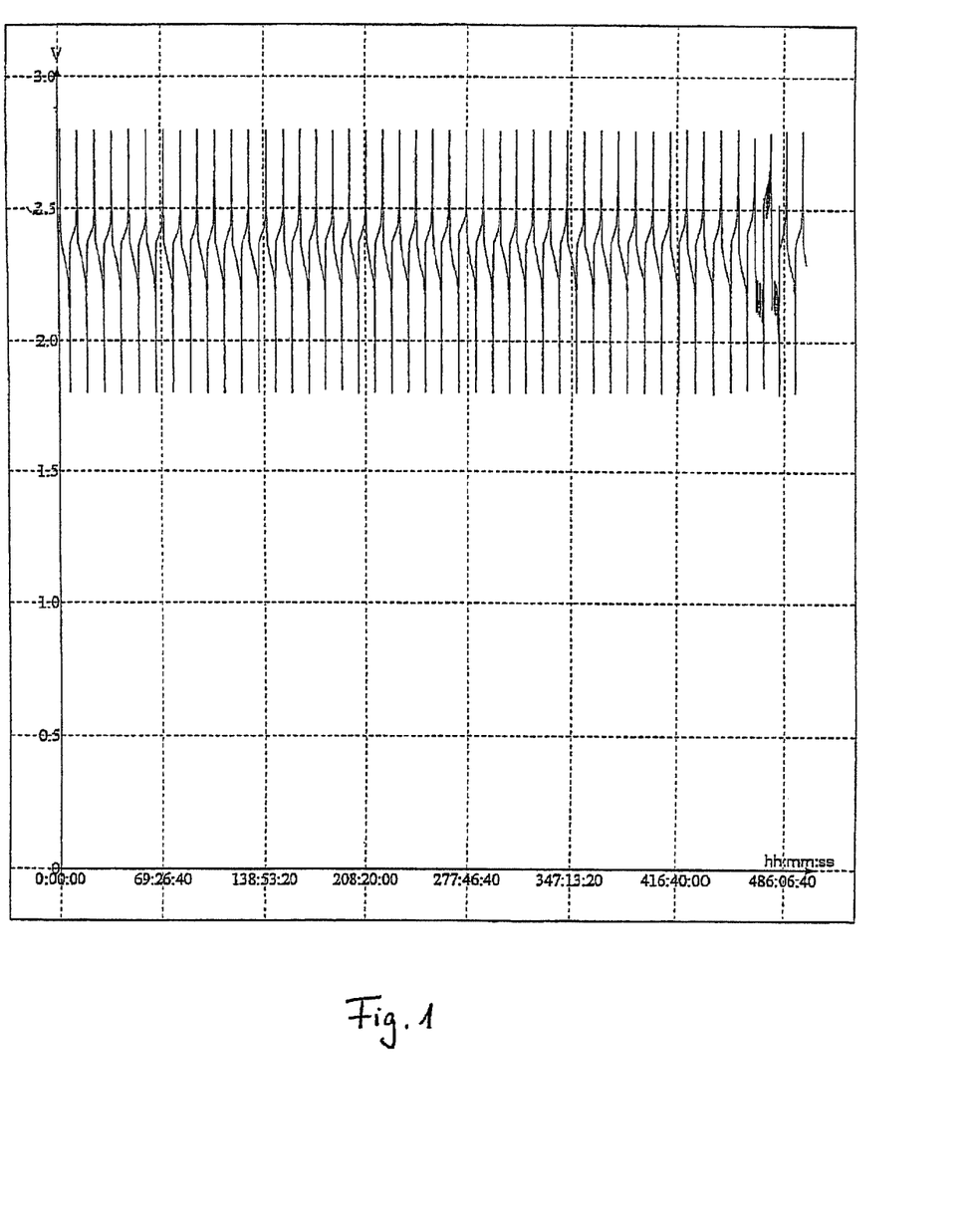
Figure 2:
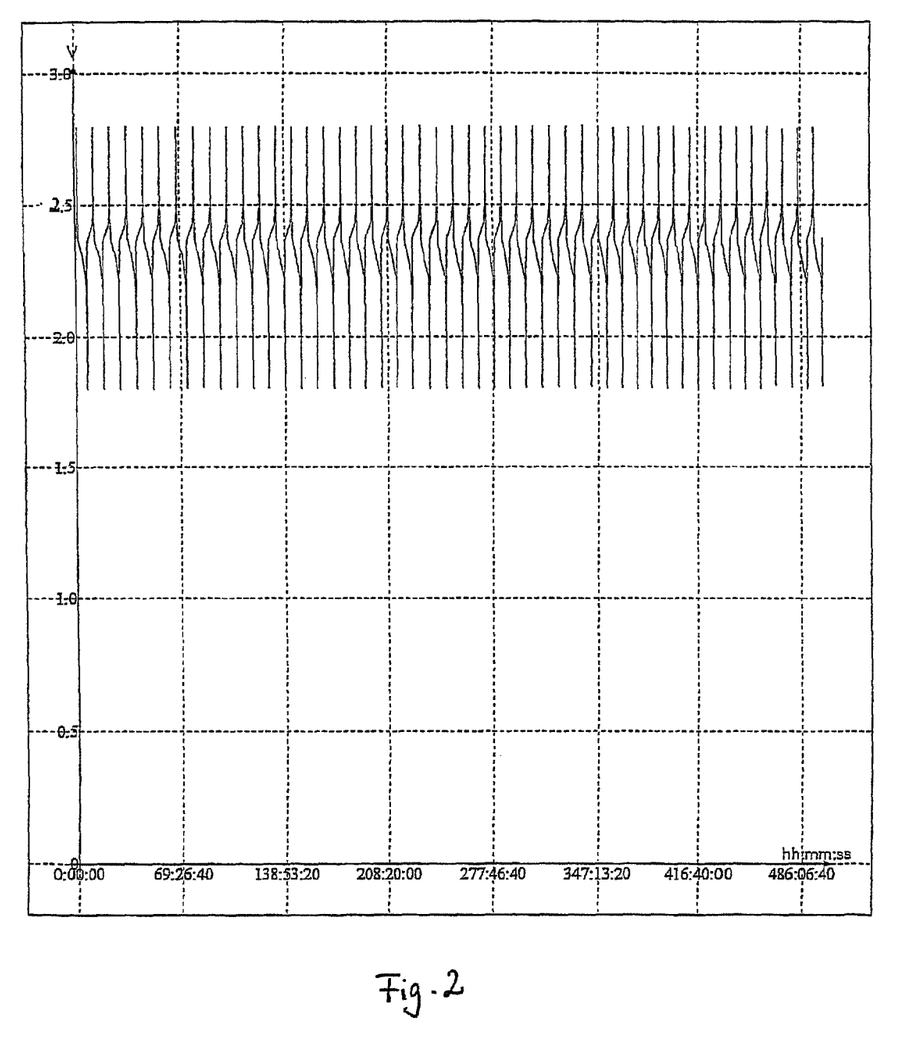
Figure 3:
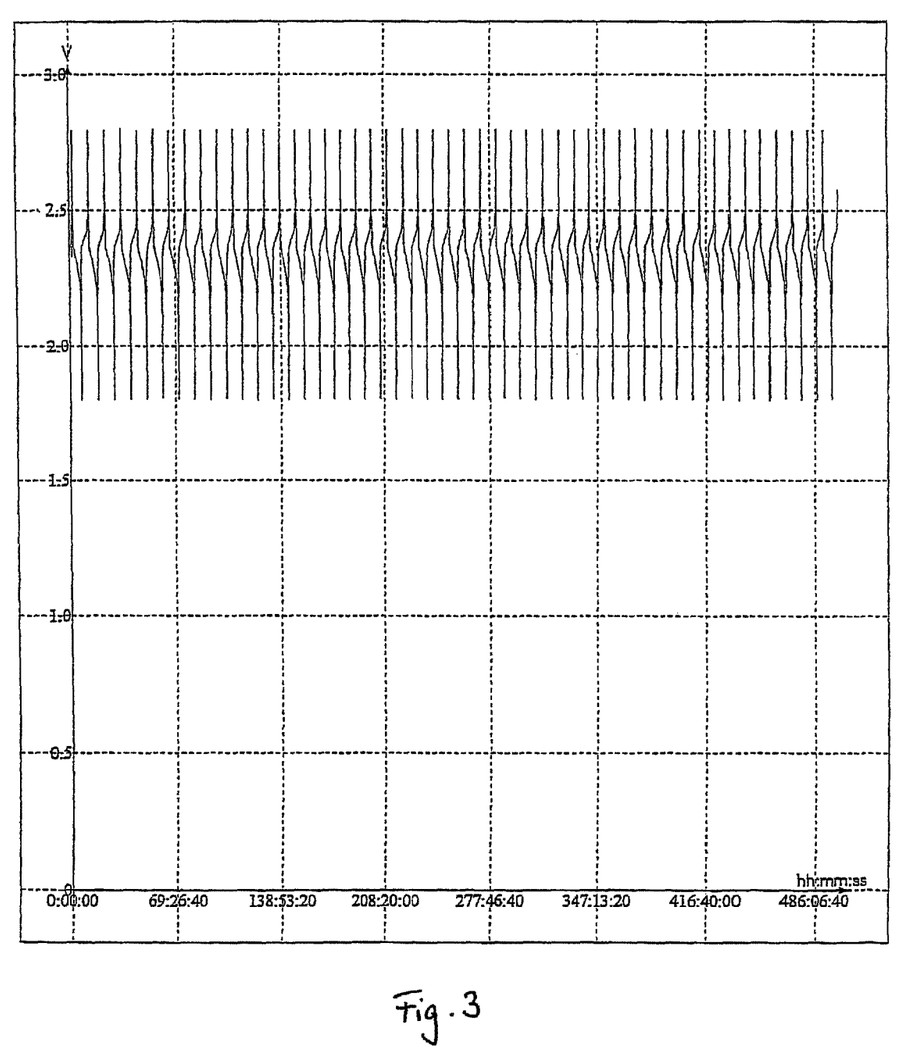

FIGS. 1-3 show the cycle data of three cells that have been produced according to the described method. The reproducibility as a function of the layer thickness and of the quality of the films as well as of the lamination process is high.

A substantial result is the achievement of a charging factor that is practically 1. Said factor describes the ratio between the loaded charge and the withdrawable charge. 1 means that the cell does not have a self-discharge. Compared thereto, Ni—Cd or Ni—MeH cells are at 1.6. Also it can easily be seen from the curves that the cells cycle in a stable manner, i.e. they are not subject to any losses or they are only subject to minimum losses of the absolute charge to be loaded and to be withdrawn in each subsequent charging and discharging process. A maximum number of charging cycles cannot be given at present, since even after several hundreds of cycles no degeneration has occurred, and long-term measurements of several 100 cycles can easily exceed 1 year.

The invention claimed is:

1. Paste-like mass that can be used in electrochemical structural elements, comprising a heterogeneous mixture of
   (1.) a matrix (A) containing at least one organic polymer, precursors thereof, or prepolymers thereof, and a plasticizer, and
   (2.) an electrochemically activatable inorganic material in the form of a solid substance (B), said material not being soluble in said matrix and in water,
   with the proviso that a conductor that is soluble in the plasticizer and that is different from (B) is not present in the mixture, wherein the plasticizer is present in a quantity of up to about 5% by weight, relative to the quantity of the electrochemically activatable material.

2. Paste-like mass in accordance with claim 1, characterized in that said plasticizer is a substance which includes the group wherein independently of each other $A^1$ and $A^2$ can be $R^1$, $OR^1$, $SR^1$ or $NHR^1$ with $R^1$ being $C_1$-$C_6$ alkyl, or $A^1$ and $A^2$ together with D form a hetero-5-ring, and D is C=O, S=O, C=NH or C=CH$_2$ and further, if D forms a hetero-5-ring with $A^1$ and $A^2$, D may alternatively be O, S, NH or CH$_2$.

3. Paste-like mass in accordance with claim 2, characterized in that independently of each other $A^1$ and $A^2$ consist of the groups O, CHR$^2$, NH or S, wherein $R^2$ is hydrogen, methyl, or ethyl, and form a hetero-5-ring together with D.

4. Paste-like mass in accordance with claim 3, characterized in that $A^1$ and $A^2$ together are -$E^1$-CHR$^2$—CHR$^2$-$E^2$-, wherein $E^1$ and $E^2$ are identical or different and are S, O, NH or CHR$^2$.

5. Paste-like mass in accordance with claim 2, wherein said plasticizer is selected from the group consisting of dimethyl sulfoxide, dimethyl carbonate, ethyl methyl carbonate, diethyl carbonate, methyl propyl carbonate, ethylene carbonate, ethylene sulfite, propylene carbonate, dioxolane, tetrahydrofurane, γ-butyrolactone or a mixture of said substances.

6. Paste-like mass in accordance with claim 1, characterized in that the organic polymer of said matrix (A) is selected from the group consisting of natural polymers, synthetic polymers and mixtures thereof.

7. Paste-like mass in accordance with claim 6, characterized in that said organic polymer is a halogenated polymer.

8. Paste-like mass in accordance with claim 1, characterized in that said matrix (A) further contains a solvent or swelling agent for said organic polymer, its precursors or its prepolymers.

9. Paste-like mass in accordance with claim 1, characterized in that said electrochemically activatable material (B) is selected from the group consisting of positive electrode materials, negative electrode materials and solid electrolyte materials.

10. Paste like mass in accordance with claim 1, wherein (B) is an electrode material and the mass additionally contains a conductivity improving agent (C), selected from the group consisting of carbon black, graphite, elementary metals and nitrides.

11. Paste-like mass in accordance with claim 7, characterized in that said halogenated polymer is a fluorinated polymer.

12. Paste-like mass in accordance with claim 11, characterized in that said fluorinated polymer is a polyvinylidene fluoride hexafluoropropylene copolymer.

* * * * *

UNITED STATES PATENT AND TRADEMARK OFFICE
CERTIFICATE OF CORRECTION

PATENT NO. : 8,076,025 B2  
APPLICATION NO. : 12/412031  
DATED : December 13, 2011  
INVENTOR(S) : Birke et al.

It is certified that error appears in the above-identified patent and that said Letters Patent is hereby corrected as shown below:

In the Specifications:

In Column 5, lines 18-33:

| Name | Appearance | Empirical Formula | Classification |
|---|---|---|---|
| Dimethyl sulfoxide * | tetrahedral | $C_2H_6OS$ | $X_j$ |
| Dimethyl carbonate | tetrahedral, | $C_3H_6O_3$ | unobjectionable |
| Ethylmethyl carbonate | linear | $C_4H_8O_3$ | |
| Diethyl carbonate | portions | $C_5H_{10}O_3$ | |
| Methylpropyl carbonate | | $C_5H_{10}O_3$ | |
| Ethylene carbonate | tetrahedral, | $C_3H_4O_3$ | $X_j$ |
| 1* Ethylene sulfite | five-membered | $C_2H_4O_3S$ | unobjectionable |
| 2* N-N'-ethylene urea | ring ether-like | $C_3H_6N_2O$ $C_4H_8O_3$ | $X_n$ $X_j$ |
| 3* Propylene carbonate $CH_3$ group | | $C_3H_6O_2$ | unobjectionable |
| 4* Dioxolane | | | |
| 5* Tetrahydrofurane | five-membered | $C_4H_8O$ | $X_j$ |
| 6* g-butyrolactone O-group | ring, ether-like | $C_4H_6O_2$ | $X_n$ | should read:

Signed and Sealed this  
Twenty-third Day of July, 2013

Teresa Stanek Rea  
*Acting Director of the United States Patent and Trademark Office*

| Name | Appearance | Empirical Formula | Classification |
|---|---|---|---|
| Dimethyl sulfoxide* | tetrahedral | $C_2H_6OS$ | $X_i$ |
| Dimethyl carbonate<br>Ethylmethyl carbonate<br>Diethyl carbonate<br>Methylpropyl carbonate | tetrahedral,<br>linear portions | $C_3H_6O_3$<br>$C_4H_8O_3$<br>$C_5H_{10}O_3$<br>$C_5H_{10}O_3$ | unobjectionable |
| Ethylene carbonate<br><br>1* Ethylene sulfite<br><br>2* N-N'-<br>ethylene urea<br><br>3* Propylene carbonate<br>$CH_3$ group<br><br>4* Dioxolane | tetrahedral,<br>five-membered ring<br><br><br><br>ether-like | $C_3H_4O_3$<br><br>$C_2H_4O_3S$<br><br>$C_3H_6N_2O$<br><br>$C_4H_6O_3$<br><br>$C_3H_6O_2$ | $X_i$<br><br>unobjectionable<br><br>$X_n$<br><br>$X_i$<br><br>unobjectionable |
| 5* Tetrahydrofurane<br><br>6* g-butyrolactone<br>O-group | five-membered ring,<br>ether-like | $C_4H_8O$<br><br>$C_4H_6O_2$ | $X_i$<br><br>$X_n$ |

In Column 13, line 37, "First, the mixture is heated to 10° C., and having" should read -- First, the mixture is heated to 100° C, and having --.